US006207891B1

(12) United States Patent
Hall et al.

(10) Patent No.: US 6,207,891 B1
(45) Date of Patent: *Mar. 27, 2001

(54) COLUMNAR-GRAINED POLYCRYSTALLINE SOLAR CELL SUBSTRATE

(75) Inventors: Robert B. Hall; Allen M. Barnett; Joseph C. Checchi, all of Newark; David H. Ford, Wilmington; Christopher L. Kendall, Hockessin, all of DE (US); James A Rand, Landenberg, PA (US)

(73) Assignee: Astropower, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/495,853

(22) Filed: Feb. 1, 2000

Related U.S. Application Data

(62) Division of application No. 09/033,155, filed on Mar. 2, 1998.

(60) Provisional application No. 60/039,418, filed on Mar. 4, 1997.

(51) Int. Cl.$^7$ .................................... H01L 31/00
(52) U.S. Cl. ........................... 136/258 PC; 136/255
(58) Field of Search ........................ 136/258 PC, 255

(56) References Cited

U.S. PATENT DOCUMENTS 5,336,335 * 8/1994 Hall et al. ........................ 136/258

* cited by examiner

Primary Examiner—Mark Chapman
(74) Attorney, Agent, or Firm—Connolly Bove Lodge & Hutz LLP

(57) ABSTRACT

The invention relates to a silicon sheet having columnar grains extending axially through the sheet from one free surface of the sheet to the other free surface. The sheet has an electrical resistivity in the range of 0.1 to 10 ohm-cm.

4 Claims, 2 Drawing Sheets

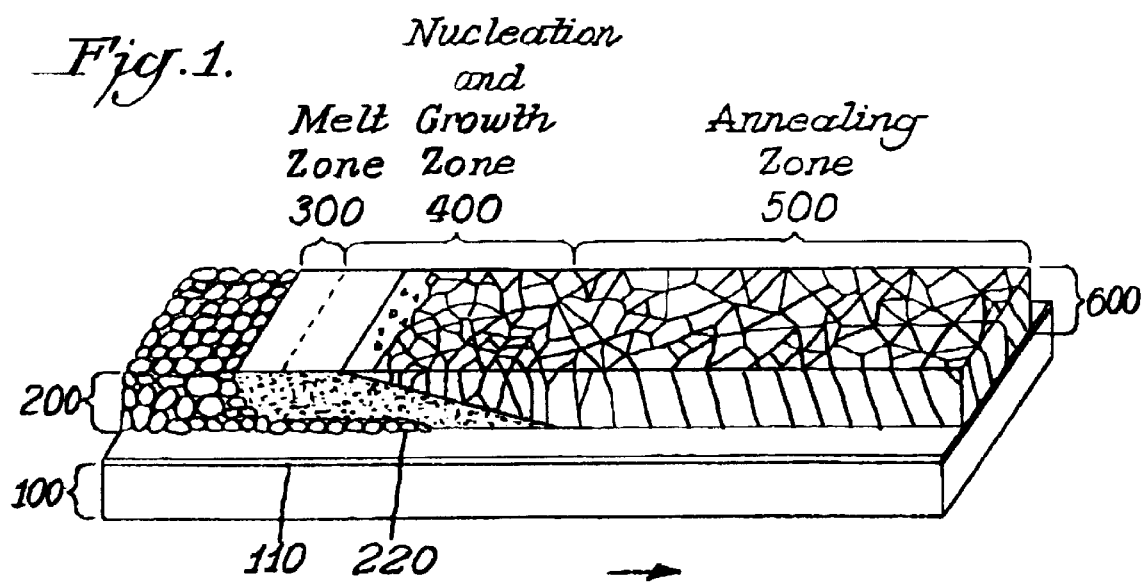
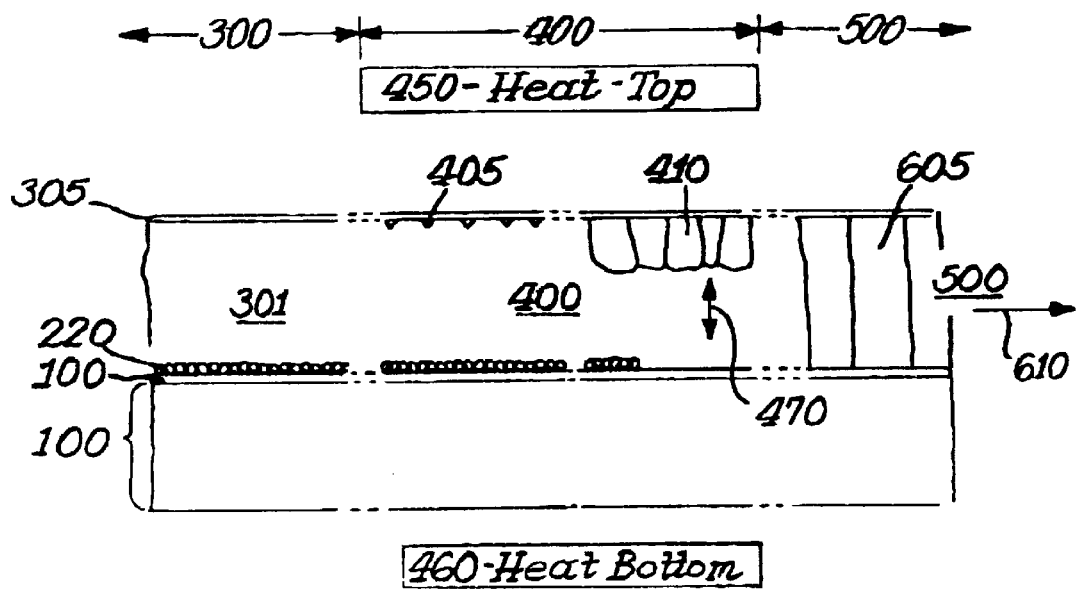

COLUMNAR-GRAINED POLYCRYSTALLINE SOLAR CELL SUBSTRATE

CROSS REFERENCE TO RELATED APPLICATION

This application is a division of application Ser. No. 09/033,155, filed Mar. 2, 1998, which in turn is based upon provisional application Serial No. 60/039,418, filed Mar. 4, 1997.

BACKGROUND OF THE INVENTION

Photovoltaic solar cells are semiconductor devices which convert sunlight into electricity. Solar cells based on crystalline silicon offer the advantage of high performance and stability. The principal barrier to expanded utilization of silicon solar cells for electric power generation is the present high cost of the solar cells.

In conventional solar cells based on single crystal or large grain polycrystalline silicon ingot processes, the major cost factor is determined by the requirement of sawing ingots into wafers. Sawing is an expensive processing step, and furthermore results in the loss of approximately half the costly ingot material as silicon dust. The problem to be solved requires the development of a low-cost process, that efficiently employs low-cost materials while maintaining solar cell performance.

The solution to the problem requires the achievement of a process that is controllable, has high a real throughput, and generates material with adequate crystalline morphology. Prior art includes several processes which either effectively achieve controlled growth, or high a real throughput of silicon sheet or ribbons. All these approaches eliminate the costly process of sawing large areas to create wafers from ingots. For example, publications by Hopkins (WEB), Ettouney, et al. (EPG), Gutler (RTR) and Eyer, et al. (SSP) describe processes that achieve controlled polycrystalline growth of grains greater than 1 mm in size at low linear speeds (and consequently low a real generation rates). Common to these sheet manufacturing processes is the fact that the sheet pulling direction and the direction of grain growth are collinear. All of these processes employ a large temperature gradient (>500 degrees Centigrade per centimeter) along the sheet pulling direction. This gradient is necessary to achieve the practical linear sheet pulling velocity (typically less than 2 cm/min), but also introduces large thermal-induced stresses. In many cases these stresses limit the achievable practical sheet width by causing sheet deformations which make solar cell fabrication untenable. Thermal stresses can also create crystalline defects which limit solar cell performance. Each of these processes attempts to achieve grain sizes that are as large as possible in order to avoid the deleterious effects of grain boundaries on solar cell performance.

Another set of processes has been developed that can achieve high a real throughput rates. For example, publications by Bates, et al. (LASS), Helmreich, et al. (RAFT), Falckenberg, et al. (S-Web), Hide, et al. (CRP) Lange, et al. (RGS) and Hall et al. (SF) describe processes that achieve polycrystalline sheet growth with grain sizes in the 10 microns to 3 mm range at high linear rates (10 to 1800 cm/min). Typically, these processes have difficulty maintaining geometric control (width and thickness) (e.g. LASS, RAFT, RGS), and/or experience difficulty with contamination of the silicon by the contacting materials (e.g. RAFT, S-Web, CRP). The process of Hall, et al. (U.S. Pat. Nos. 5,336,335 and 5,496,416) effects geometric control and minimizes the contact of the growing silicon with deleterious materials. Common to these sheet growth processes is the fact that the sheet pulling direction and the direction of crystalline grain growth are nearly perpendicular. It is this critical feature of these processes that allows the simultaneous achievement of high linear sheet pulling velocities and reduced crystal growth velocities. Reduced crystal growth velocities are necessary for the achievement of materials with high crystalline quality.

The prior art regarding the fabrication of solar cells from polycrystalline silicon materials requires that the grain size be greater than 1.0 mm. This requirement on grain size was necessitated by the need to minimize the deleterious effects of grain boundaries evident in prior art materials. Historically, small-grained polycrystalline silicon (grain size less than 1.0 mm) has not been a candidate for photovoltaic material due to grain boundary effects. Grain boundary recombination led to degradation of voltage, current and fill factors in the solar cell. Previous models, for example Ghosh (1980) and Fossum (1980), based on recombination at active grain boundaries correctly predicted performance of historical materials. These models teach that if active grain boundaries are present, they prohibit the utilization of small grained materials in high performance solar cells.

SUMMARY OF THE INVENTION

It is the object of this invention to provide a low-cost process for forming low stress, columnar-grained sheets that are employed in high performance solar cells.

A further object of this invention is to provide techniques for manufacturing columnar-grained polycrystalline silicon sheets for use as a substrate in solar cells, which overcomes the disadvantages of the prior art.

A yet further object of this invention is to provide a process for manufacturing a low-cost solar cell that employs small-grained polycrystalline silicon with low-activity grain boundaries.

A still further object of this invention is to provide a substrate and a solar cell made from such process.

In accordance with this invention the sheet is formed by using a columnar growth technique that manages the details of nucleation, growth, and heat flow to control the material quality and decouple the grain growth velocity from the linear sheet pulling velocity of the polycrystalline material. The process begins with granular silicon that is applied to a setter material; the setter and silicon are then subjected to a designed thermal sequence which results in the formation of a columnar-grained polycrystalline silicon sheet at high a real throughput rates. The equipment employed to accomplish the process includes a distributed source of energy application, such as by graphite-based infrared heating. The invention may also be practiced with a process which includes a line source, such as by optical focusing.

BRIEF DESCRIPTION OF THE DRAWINGS

FIG. 1 illustrates a perspective view showing the sequence for fabricating low stress, columnar-grained silicon sheets usable as solar cells substrates;

FIG. 2 illustrates a perspective view showing the sequence of nucleation and growth of the silicon sheet in accordance with this invention.

DETAILED DESCRIPTION

Figure 3:
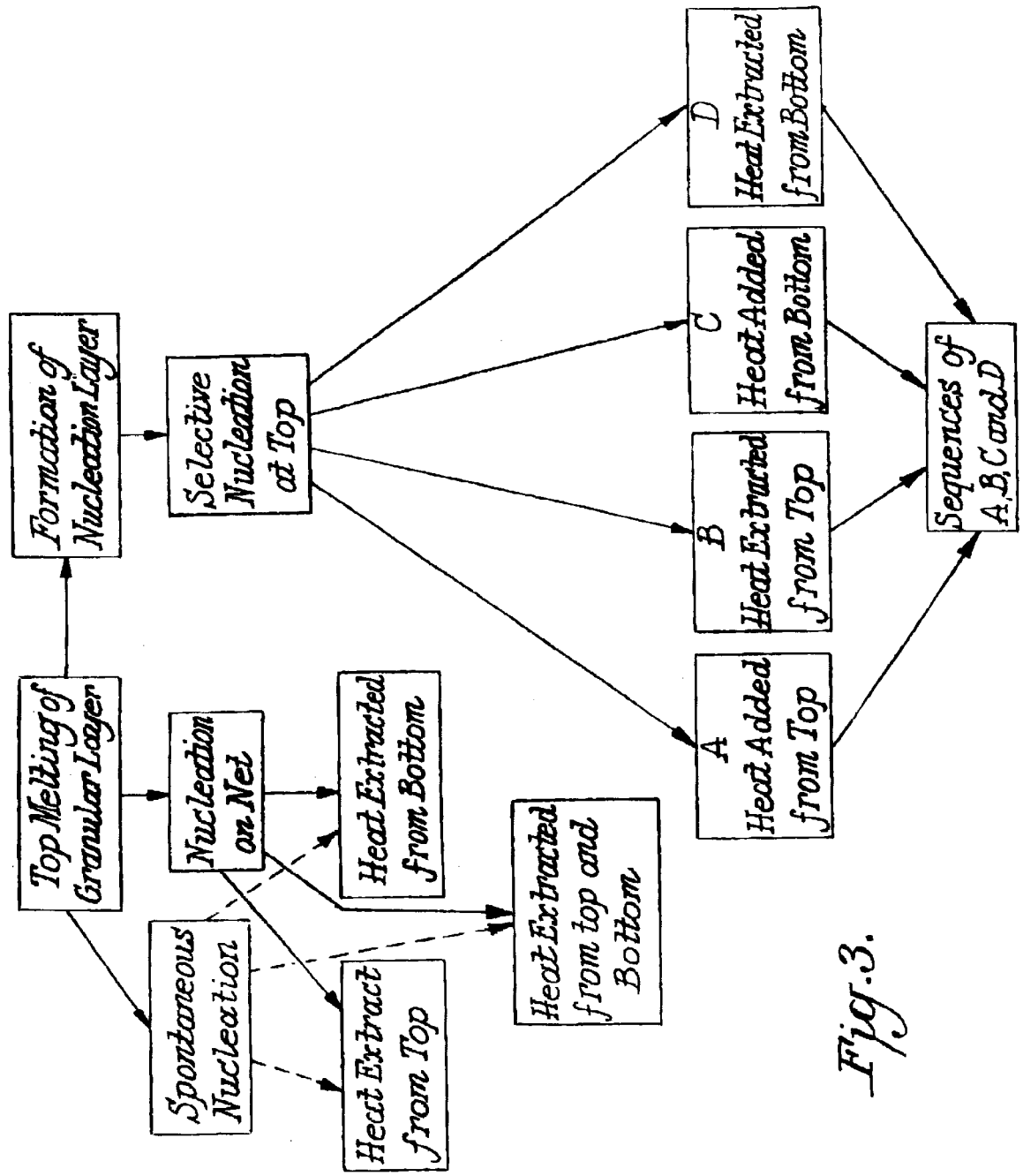
FIG. 3 illustrates the manifold of process steps leading to the manufacture of the same.

The present invention is directed to techniques used for making improved columnar grain polycrystalline sheets which are particularly adaptable for use as substrates or wafers in solar cells. The techniques are based upon the techniques in U.S. Pat. Nos. 5,336,335 and 5,496,446, all of the details of which are incorporated herein by reference thereto. The ability to use the sheet as a solar cell substrate makes possible the provision of a solar cell consisting entirely of silicon material where the sheet would function as a substrate made of silicon and the remaining layers of the solar cell would also be made of silicon. The desired properties of the columnar-grained silicon sheet or substrate fabricated with the teaching of this invention are: flatness, a smooth surface, minority carrier diffusion length greater than 40 microns, minimum grain dimension at least two times the minority carrier diffusion length, low residual stress and relatively inactive grain boundaries. Since the minimum grain dimension of the columnar grain silicon sheet is at least two times the minority carrier diffusion length which in turn is greater than 40 microns, the columnar grains would have a grain size greater than 80 microns. Grain sizes down to 10 microns can be employed with minority carrier diffusion length greater than 10 microns, and will lead to solar cells having lower currents, and lower power. The desired properties of a process for fabricating columnar-grain silicon material appropriate for inclusion in a low-cost solar cell in accordance with the teachings of this invention are: low thermal stress procedure, controlled nucleation, high a real throughput, and simple process control.

The criteria for the columnar-grain silicon material product of flatness and smoothness are required to make solar cell fabrication tenable. The requirements on diffusion length and grain size are to minimize recombination losses in the bulk and at grain surfaces (i.e. grain boundaries), respectively. The requirement of relatively inactive grain boundaries is to effect the minimization of grain boundary recombination. The requirement of low residual stress is to minimize mechanical breakage and to maintain high minority carrier diffusion lengths.

The criteria for the columnar-grained silicon process of a low thermal stress procedure is to effect minimization of bulk crystalline defects. The requirement of controlled nucleation is to affect the achievement of the required grain morphology and size. The criteria for high a real throughput and simple process control are to achieve low-cost and manufacturability.

FIG. 1 is a perspective view illustrating the sequence for fabricating low stress, columnar-grained silicon sheets. The process as depicted moves from left to right. In general, a setter material 100, which serves as a mechanical support, is coated with a granular silicon layer 200, and is passed through a prescribed thermal profile. The prescribed thermal profile first creates a melt region 300 at the top of the granular silicon 200, and then creates a nucleation and growth region 400 where both liquid and a growing layer of polycrystalline layer coexist. Finally, there is an annealing region 500 where the temperature of the polycrystalline silicon sheet layer 600 is reduced in a prescribed manner to effect stress relief. Any or all of the preheat, melting, growth and anneal thermal profiles for the granular powder and resultant sheet could be achieved by graphite-based heater technology.

The setter material 100 is selected based on the following requirements. It must: maintain its shape during the sheet formation thermal processing; not chemically interact with, or adhere to, the silicon material; and possess the proper thermal characteristics to effect the required sheet growth and annealing. The form of the setter material may either be as a rigid board or as a flexible thin belt.

Several materials including, but not limited to, quartz, refractory boards (e.g. silica and/or alumina), graphite, silicon nitride and silicon carbide have been employed and maintained the proper geometric shape during thermal processing.

To assure that the setter 100 does not adhere to the final polycrystalline silicon sheet 600, a release agent coating 110 is applied to the setter. Either, or a combination of, silicon nitride, silicon oxynitride, silica, powdered silicon, alumina, silicon carbide or carbon in any form have been employed as this agent. A low-cost method for applying this coating is to form a liquid slurry that is painted or sprayed on the bare setter, and subsequently dried before use. The release agent coating may also be applied by the method of chemical vapor deposition. The release agent facilitates separation of the sheet and permits reuse of the setter material.

In the process design the thermal characteristics of the setter 100 play a key role in managing the melt and growth processes. In the melt region 300 it is preferred that the thermal conductivity of the setter be high to assure the efficient deployment of the energy being used to melt the granular silicon 200.

In a preferred embodiment the setter material is graphite. The setter preparation is completed by coating the top surface with a release agent 110. This is accomplished using an aqueous colloidal solution of silicon nitride that is painted on the top surface and baked to form a non-wetting, non-adhering oxynitride layer, before the initial application of granular silicon.

The granular silicon 200 must be properly sized and be of adequate purity. The range of proper sizes for the granular silicon 200 employed in the process is between 20 and 1000 micrometers. The upper limit is determined by the design thickness for the silicon sheet material. Preferably the silicon powder is comprised of sizes less than 500 microns and the sheet is formed at a sheet pulling of greater than 20 cm/min. As a rule the dimensions of the silicon particles should be equal to or less than the desired thickness of the silicon sheet material. The lower size limit of the particle distribution is dependent on the dynamics of the melting process, and the need to limit the amount of silicon oxide. The silicon oxide is a source of sheet contamination, and naturally occurs at all silicon surfaces.

There are several techniques for applying the silicon to the setter that include, but are not limited to, doctor blading, plasma-arc spraying and tape casting.

The purity level necessary in the sheet silicon is determined by the requirements of the specific application of the sheet. Whereas the employment of low-processed metallurgical grade silicon is not adequate for the efficient operation of a solar cell device, utilization of highly processed semiconductor grade silicon is not necessary. In practice, for direct solar cell applications the preferred process can be executed with off-grade semiconductor grade silicon.

The addition of a separate constituent in, or with, the granular silicon may be employed to effect the optical bandgap of the sheet. Additions of carbon, and in particular germanium, can increase (carbon) or reduce (germanium) the optical bandgap. Such changes in the optical bandgap of the sheet material are desirable depending on the spectral output of the incident radiation being employed with a solar cell design. In the case of germanium combinations of silicon and germanium can be used where either can be from 0 to 100% (by mass).

The addition of a separate constituent in, or with, the granular silicon may be employed to effect an electrical resistivity in the range of 0.1 to 10 ohm-cm in the sheet material. Typically, for p-type conductivity in the sheet material the preferred elements are boron, aluminum, or indium. As an example of the preferred embodiment, the addition of powdered boron silicide followed by mechanical mixing of the granular silicon provides for the accomplishment of the required p-type resistivity in the subsequently grown silicon sheet.

The properly doped p-type granular silicon 200 is uniformly layered on the coated setter 100. For example, in a preferred embodiment this process can be effectively accomplished by using a doctor blade. The spacing between the edge of the doctor blade and the setter surface needs to be at least two times the dimension of the largest particle in the granular silicon size distribution. Furthermore, the thickness of the final silicon sheet 600 can be the dimension of the largest particle in the granular size distribution.

The silicon-coated setter is transported into an environmental chamber with an argon or nitrogen overpressure. In a preferred embodiment a mixture of argon and hydrogen gas is employed to effectively limit the amount of silicon oxide that is formed during the growth process. The percent of hydrogen employed is determined by the water vapor content in the chamber. The ratio of hydrogen to water vapor controls the magnitude of silicon oxide formation. Preferably 5–100% by volume hydrogen gas is used to reduce the silicon oxide. The chamber may include a pre-heat zone employed to raise the temperature to 1100° to 1400° C., which in combination with the hydrogen has the effect of reducing the native oxide of silicon that exists on the granular silicon. In another preferred embodiment a combination of nitrogen and argon (other non-reacting gases such as helium, neon and krypton will also work) in the environmental chamber is employed where either can be from 0 to 100% (by volume).

After the granular silicon 200 has been pre-heated it is then brought into a thermal zone 300 where the top portion of the granular silicon layer 200 is melted. The depth of the granular silicon that is melted depends on the intensity of the input energy from thermal zone 300, the thickness of the granular silicon layer, the linear speed of the granular silicon coated setter through thermal zone 300, and the details of heat transfer between the granular silicon 200 and the setter 100. Between 25 and 90% (and preferably between 50% and 90%) of the granular silicon depth is melted, primarily from the top. The material at the bottom of the granular layer is partially melted by liquid silicon penetrating from the molten silicon layer above. This partially melted layer of silicon forms a net 220. The net 220 is responsible for two process features. First, because it is wetted by the molten silicon above, this layer stabilizes the melt and growth zones by defeating the surface tension of the molten silicon overlayer. This allows the production of wide sheets, with smooth surfaces. Sheets widths of up to 38 cm have been manufactured. Second, this layer can serve as a plane to nucleate subsequent growth (as described in U.S. Pat. No. 5,496,416).

FIG. 2 is a perspective view showing the sequence of nucleation and growth of the silicon sheet. A thin-film capping layer is formed on the top surface of the liquid silicon 301 while it is in the melt zone 300. The role of the capping layer (nucleation layer 305 in FIG. 2) is to effect the mechanism of heterogeneous nucleation. In this process (see Chalmers, *Principles of Solidification*, John Wiley & Sons, New York, 1964) nucleation is controlled by the formation of nuclei of critical size catalyzed by a suitable surface in contact with the liquid. The "nucleation catalyst" or "nucleant" may be either a solid particle suspended in the liquid, a liquid containing surface, or a solid film, such as an oxide or nitride. In this invention the "nucleant" may be applied as a coating to the granular silicon before the introduction into the environmental chamber or applied in situ.

In the grain growth process described by the present invention the rate of grain growth is determined by the details of heat extraction from the melt, and the grain size is determined by the nucleation density. By employing a nucleation layer 305 the nucleation occurs in a preferred manner at the nucleation-layer/molten-silicon interface, and the nucleation density is actually reduced compared to a free molten liquid surface. This allows for the achievement of controlled growth and increased grain sizes in the manufactured sheet.

One method to effect a "nucleant" layer is to apply it to the granular silicon prior to introduction into the environmental chamber. The coating materials in this manner to effect nucleation of the silicon growth include, but are not limited to, the carbides, nitrides, oxides and oxynitrides of silicon, the oxides and nitrides of boron, and aluminum oxide. The selected materials were chosen based on the need to maintain required purity requirements of the resultant silicon sheet.

In another method the coating 305 may be formed in-situ on the free surface at the top of the liquid 301 in the melt zone 300. The coating materials employed on the free surface of the liquid 301 to effect nucleation of the silicon growth include, but are not limited to, the carbides, nitrides, oxides and oxynitrides of silicon, the oxides and nitrides of boron, and aluminum oxide. The selected materials were chosen based on the need to maintain required purity requirements of the resultant silicon sheet. In a preferred embodiment the carbides, nitrides, oxides and oxynitride employed as coatings 305 on the free surface of the melt 300 may be formed by the utilization of carbon, oxygen, and/or nitrogen containing gases as the process gas in the environmental chamber.

In the preferred embodiment the nucleation layer 305 is formed by the reaction of nitrogen in the process gas with the free liquid silicon surface 301. For example, an effective nucleation layer is formed in a combination of nitrogen and argon (combined total 100%) when the nitrogen is 10% or greater (by volume). The reaction of the nitrogen gas and the free surface of the liquid silicon 301 forms a layer of nitrided silicon. It is a further embodiment of the present invention that a small amount of oxygen gas (10 to 1000 ppm by volume) can be added to the nitrogen-argon combination to improve the nucleation properties of the nucleation layer 305.

After leaving the melt creation zone 300 of the thermal profile, the melt pool 301 with a nucleation layer 305 and the partially melted silicon net 220 moves into the nucleation and growth zone. FIG. 2 also illustrates the process occurring in the nucleation and growth zone 400. FIG. 2 indicates schematically the means of controlling the process of nucleation and growth in zone 400 by managing the application and removal of heat. This is depicted in the figure by Heat Management from the top 450, and Heat Management from the bottom 460.

Generally, nucleation and growth proceed as follows. A series of preferred nucleation sites 405 are formed in zone 400 at the interface between the liquid silicon 301 and the nucleation layer 305. The details of this formation process are effected by the means of heat management from the top 450 and the bottom 460. After formation of the preferred nucleation sites 405, grain growth 410 on these sites is effected by modifying the heat management 450 and 460. The direction 470 of the grain growth front is approximately perpendicular to the plane of the setter, and perpendicular to the direction 610 in which the sheet is being pulled. The length of the growth zone along the direction of setter motion is from 10 centimeters to a maximum related to the sheet thickness, and the magnitude of the sheet pulling velocity and the grain growth velocity. The length of the growth zone is determined by controlling the rate of loss of heat (and therefore growth rate) attending the solidification process. As a consequence of the growth process, the grains that are grown are columnar in nature. Typically, individual columnar grains 605 in the resulting sheet 600 have their axial direction extend from the top surface to the bottom, and are at least as wide as they are high. Sheet thicknesses in the range of 400 to 800 microns can be achieved at sheet pulling speeds in excess of 120 cm/min.

After leaving the nucleation and growth zone 400 of the thermal profile, the sheet 600 moves into the annealing zone 500 of the thermal profile. In this zone the grown sheet, still at approximately 1400° C., is subjected to a near temperature gradient along the direction of setter motion. The linear temperature profile eliminates buckling and cracking of the as grown sheet, and minimizes the generation of dislocations. The grown sheet may have a thickness between 50 microns and 2 mm. The thickness of the grown sheet is in the range of 350 to 1000 microns in the preferred process. Because the thickness of the final grown sheet 600 is determined by the precise application of granular silicon 200 to the setter 100, exceptional sheet thickness control and process stability are achieved in comparison to sheet technologies pulled from a melt, where thickness is controlled by the melt meniscus. After cool down, the sheet is removed from the setter, and appropriately sized by sawing or scribing, for fabrication into solar cells. The setter is reused for making further columnar-grained polycrystalline sheets.

FIG. 3 depicts the process steps that can be employed by the invention to achieve the silicon sheet at high sheet pulling velocities. There are several nucleation and growth regimes that have been successfully employed. Below are several examples derived from FIG. 3.

The properties of the sheet material fabricated with the above process are quite amenable to the fabrication of efficient solar cells. This process generates material that has unique properties of size and character. Although the grains are columnar, and have average sizes in the range of 0.002 to 1.000 cm in extent, solar cells fabricated on material in the range of 0.01 to 0.10 cm may achieve voltages in excess of 560 mV, and fill factors in excess of 0.72. The achievement of these values on such small grained material indicate that this material is not being limited by recombination at grain boundaries as had been previously predicted by Ghosh. Previously, columnar grains that extend from surface to surface of the sheet were dismissed as being ineffective since columnar grains were always small, and small grains were thought not to work. The process herein described achieves columnar grains that yield material with relatively benign grain boundaries with the result that efficient, low-cost solar cells can be manufactured.

It is a unique feature of the top-down grain growth process described above that the device-active region at the top of the sheet is crystallized from the silicon melt while the bottom of the sheet next to the setter is still solid, thus minimizing any contamination of the top of the sheet by the setter. It is a further advantage of the top-down grain growth process that purification of the device-active region is effected by fractional solidification (see: Zief and Wilcox, *Fractional Solidification*, Marcel Dekker, New York, 1967). By this method the most pure grown material is at the top of the sheet where the initial grain growth occurs. The subsequent grain growth process has the effect of sweeping impurities to the bottom of the solidified sheet away from the device-active region (similar to zone refining).

The process herein described can be carried out in a continuous manner, resulting in continuous sheets that can be appropriately sized using an in line scribe or a saw. Impurity content in the melt and grown sheet quickly reaches steady-state; it does not increase during continuous processing. Since all embodiments include application of granular silicon to the setter, and since material enters the melt creation zone in this form, melt replenishment is not a problem, unlike sheet technologies pulled from a melt pool. After being properly sized, the sheets function as a substrate by having the remaining layers formed thereon to produce solar cells. Where the remaining layers are of silicon (or an alloy to tailor the optical bandgap, such as carbon or germanium), a complete solar cell results. This sheet material can also be the substrate for other solar cell fabrication processes including those employing cadmium telluride and copper-indium selenide. Thus an advantage of the invention is that it lends itself to mass production. The invention results in a free standing grown continuous sheet of silicon which could then be cut to individual sizes in accordance with its end use.

The present invention anticipates the forward integration of the silicon sheet product in subsequent processing into solar cells and modules. It is expected that the solar cell fabrication steps, including, but not limited to, surface preparation, junction formation, electrical contacts and anti-reflection coatings, can all be accomplished with the product in its sheet form. Such continuous processing will have the advantage of significantly reducing manufacturing costs.

EXAMPLE 1

The mechanism of spontaneous nucleation (see FIG. 3) is operative when the liquid silicon 301 has become super-cooled, and in the absence of any uniform extraction of heat in the nucleation and growth zone 400, results in a solid-liquid interface that is inherently unstable. This instability leads to dendritic growth which is typically equiaxed in geometry. Such grain growth may or may not extend from one sheet surface to the other.

EXAMPLE 2

In another variation of the process (see FIG. 3) the silicon net 220 serves as the source of nucleation of grain growth from the liquid silicon 301. In this case the heat is most effectively extracted from the bottom 460. In order to reduce the rate of grain growth it may be desirable to apply some heat from the top 450. Heat extraction from the bottom can be effected by means of radiation plates. Heat addition at the top is effected by means of planar heaters. For example, to effect a grain growth rate of 0.15 cm/min for a 700 micrometer thick sheet moving at sheet speed of 100 cm/min requires a net heat removal rate from the bottom (i.e. heat extracted from bottom minus heat added to top) of approximately 10 watts/cm2, and results in a nucleation and growth zone length of 46 cm. In this process regime the solid-liquid interface is stable leading to the growth of columnar grains that extend from the net at the bottom of the sheet up to the free surface of the sheet. This example has been described in U.S. Pat. No. 5,496,416.

EXAMPLE 3

In another variation of the process (see FIG. 3—formation of, and growth from, a nucleation layer) granular silicon in the size range of 75 to 350 micron is doctor-bladed onto a graphite setter coated by a mold release coating consisting of a mixture of the oxides and nitrides of silicon. The granular silicon and setter are then transported at a continuous velocity through a graphite-based heating chamber under a 100% nitrogen gas atmosphere bringing the silicon and setter to a temperature close to 1400° C. During this time the majority of silicon oxide that existed on the granular silicon surfaces is volatilized and subsequently removed from the heated chamber. The silicon and setter continues in the chamber to a zone where the silicon is melted, primarily from the top, leaving a silicon net at the bottom. During this time a thin-film capping layer of silicon nitride is formed on the free surface of the silicon. The thin-film of silicon nitride plays the role of a nucleation layer in the next zone of the chamber where minimal external heat is applied and the nucleation sites are preferentially created at the thin-film layer/molten silicon interface. The layer combination of setter, silicon net, liquid silicon and thin layer of silicon nitride with an array of nucleation sites continues into a zone where heat is preferentially removed from the top 450. In this case, the grains grow down from the nucleation sites occurring at the thin-film/molten silicon interface and terminate at the silicon net at the bottom. The grain growth rate is determined by the details of heat extraction 450. In this process regime the solid-liquid interface is stable leading to the growth of columnar grains that extend from the nucleation layer at the top of the sheet to the net at the bottom of the sheet.

EXAMPLE 4

Same as Example #3 except after an initial top-down grain growth from the nucleation layer through most of the molten thickness, the sheet moves into a subsequent zone that adds heat from the bottom 460, such that the net layer and some portion of the previously top-down grown grains are melted. The sheet then continues to a zone where the heat is again extracted from the top 450. The growth now resumes from the solid-liquid interface of the initially grown grains and continues all the way through the sheet to the bottom of the sheet. In this process regime the solid-liquid interface is stable and results in the growth of columnar grains that extend from the nucleation layer at the top of the sheet to the bottom of the sheet. This process also has the capability of sweeping out impurities to the back of the sheet by a process similar to zone refining.

These examples are for illustrative purposes and are not intended to represent all the processes anticipated by the present invention.

What is claimed is:

1. A sheet of silicon having a pair of free surfaces, columnar grains extending axially through the sheet from one free surface to the other free surface, said sheet having an electrical resistivity in the range of 0.1 to 10 ohm-cm, and said surfaces being free of any outer integral residual net.

2. The sheet of claim 1 wherein the sheet includes at least some amount of nitrogen.

3. The sheet of claim 2 wherein said sheet functions as a substrate, and the sheet being in combination with photovoltaic layers to comprise a solar cell.

4. The sheet of claim 1 wherein said sheet functions as a substrate, and the sheet being in combination with photovoltaic layers to comprise a solar cell.

* * * * *